(12) United States Patent
Chandhok et al.

(10) Patent No.: US 7,022,443 B2
(45) Date of Patent: Apr. 4, 2006

(54) COMPENSATION OF REFLECTIVE MASK EFFECTS IN LITHOGRAPHY SYSTEMS

(75) Inventors: Manish Chandhok, Portland, OR (US); Michael Goldstein, Ridgefield, CT (US)

(73) Assignee: Intel Corporation, Santa Clara, CA (US)

( * ) Notice: Subject to any disclaimer, the term of this patent is extended or adjusted under 35 U.S.C. 154(b) by 202 days.

(21) Appl. No.: 10/366,583

(22) Filed: Feb. 12, 2003

(65) Prior Publication Data

US 2004/0157136 A1    Aug. 12, 2004

(51) Int. Cl.
*G03F 7/20* (2006.01)

(52) U.S. Cl. .................................................. 430/30

(58) Field of Classification Search ............... 430/5, 430/22, 30; 359/350–361; 378/34, 35
See application file for complete search history.

(56) References Cited

U.S. PATENT DOCUMENTS

| 5,153,898 | A  | * | 10/1992 | Suzuki et al. ............... 378/34 |
| 6,226,346 | B1 | * | 5/2001  | Hudyma ....................... 378/34 |
| 6,266,389 | B1 | * | 7/2001  | Murayama et al. ........... 378/34 |
| 6,646,729 | B1 | * | 11/2003 | van der Laan et al. ..... 356/124 |
| 6,787,789 | B1 | * | 9/2004  | Van Der Laan ............. 250/548 |
| 2004/0013956 | A1 | * | 1/2004 | Sogard ........................ 430/30 |

* cited by examiner

*Primary Examiner*—Kathleen Duda
(74) *Attorney, Agent, or Firm*—Fish & Richardson P.C.

(57) ABSTRACT

Aberrations may be introduced in mirror surfaces used in a lithography system utilizing a reflective mask to compensate for adverse optical effects associated with reflective masks. A spherical aberration may be introduced to compensate for a shift in the location of best focus. A coma aberration may be introduced to compensate for a pattern shift.

11 Claims, 8 Drawing Sheets

COMPENSATION OF REFLECTIVE MASK EFFECTS IN LITHOGRAPHY SYSTEMS

BACKGROUND

Many lithography systems use transmissive masks to image a pattern on a wafer. Light which passes through transparent portions of the mask may form a pattern on a photoresist material on the mask. Lithography systems may also use reflective masks to image a pattern on a wafer. Light may be reflected off of a reflective mask rather than passing through the mask, as with a transmissive mask.

Light may be directed to a reflective mask at an incident angle off normal. Due to this angle of incidence, features parallel to the plane of incidence (e.g., horizontal features) may exhibit a shadowing effect. Features parallel to the plane of incidence (e.g., vertical features) may not exhibit the shadowing effect.

The difference in shadowing effect between the horizontal and vertical features may make the horizontal features projected onto the imaging plane larger than the vertical features. To compensate for this effect, the horizontal features may be drawn on the mask such that they are scaled smaller than the vertical features.

DETAILED DESCRIPTION

Figure 1:
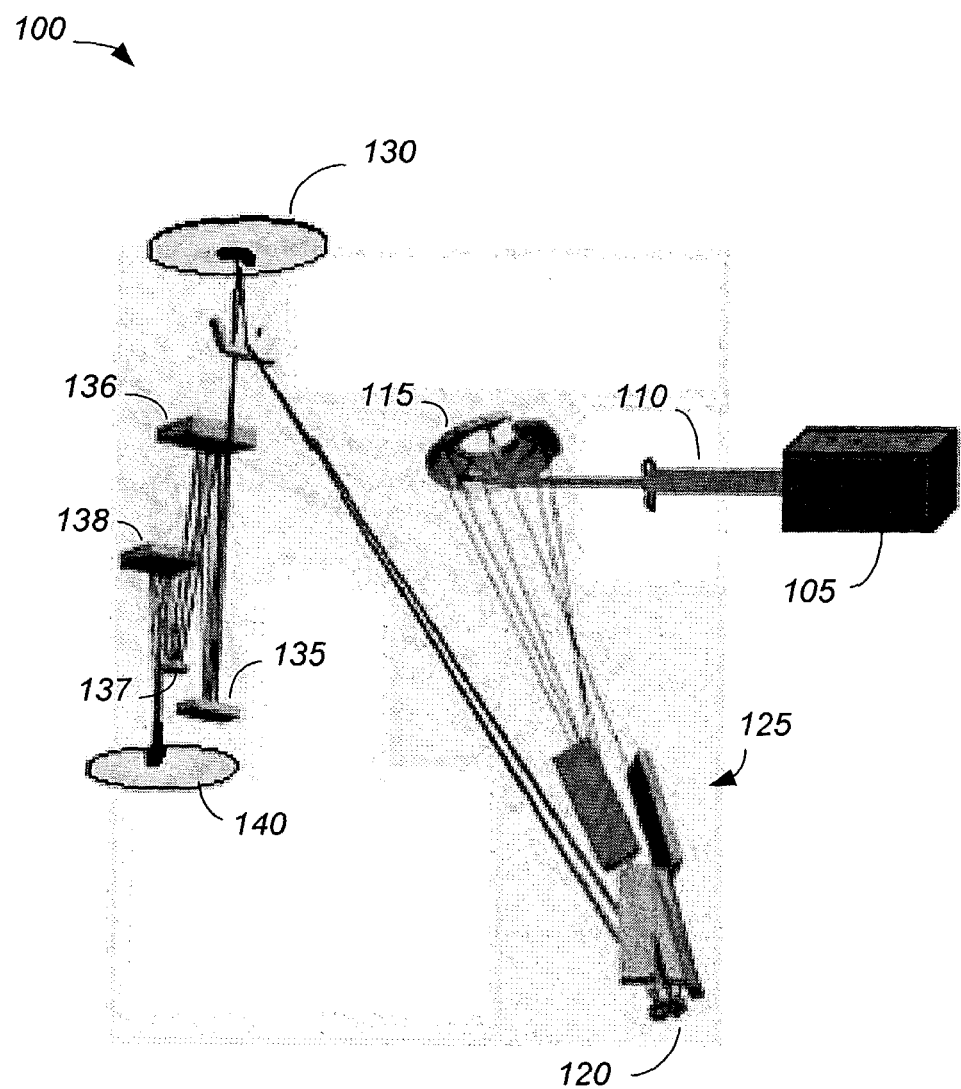
FIG. 1 is a block diagram of an extreme ultraviolet (EUV) lithography system.

FIG. 1 illustrates a lithography system 100. In an embodiment, the lithography system may be an Extreme Ultraviolet (EUV) lithography system. EUV lithography is a projection lithography technique which may use a reduction optical system and illumination in the soft X-ray spectrum (e.g., wavelengths in the range of about 10 nm to 20 nm).

The system 100 may include a source 105 of EUV radiation 110, imaging collectors 115, a pupil 120, condenser optics 125, a reticle mask 130, and an optical system including four high precision mirrors 135–138. The optical elements in the system (e.g., the imaging collectors 115, pupil 110, condenser 125, and mirrors 135–138) may be mirrors made to be reflective to EUV light of a particular wavelength (typically 13.4 nm) by means of multilayer coatings, e.g., alternating layers of molybdenum and silicon (Mo/Si) or molybdenum and beryllium (Mo/Be). The alternating layers may produce constructive interference in the direction of reflection. Since EUV is strongly absorbed by materials and gases, the lithography process may be carried out in a vacuum, and a reflective, rather than transmissive, reticle mask 130 may be used.

The source 105 of soft X-rays may be a compact high-average-power, high-repetition-rate laser which impacts a target material to produce broad band radiation with significant EUV emission. The target material may be, for example, a plasma generated from a noble gas, such as Xenon (Xe). The target material may convert a portion of the laser energy into EUV radiation with an energy of about 90 eV to 100 eV.

The condenser optics 125 may collect EUV light from the source and condition the light to uniformly illuminate the mask 130 and properly fill the pupil 110. The condenser optics may include a series of aspheric mirrors, which collect the radiation and reflect it at a low angle.

The radiation from the condenser optics may be directed to the mask 130. The mask may include a multiple-layer reflecting substrate with a patterned, absorbing overlayer. The reflected EUV radiation from the mask 130 may carry an integrated circuit (IC) pattern on the mask 130 to a photoresist layer on a wafer 140 via the optical system including multilayer mirrors 135–138. The entire reticle may be exposed onto the wafer 140 by synchronously scanning the mask and the wafer, e.g., by a step-and-scan exposure.

The center of best focus in a lithographic imaging operation may ideally be at zero defocus. However, the use of reflective masks in EUV Lithography has been shown to introduce a shift in the location of best focus that varies as a function of feature size and pitch.

Figure 2:
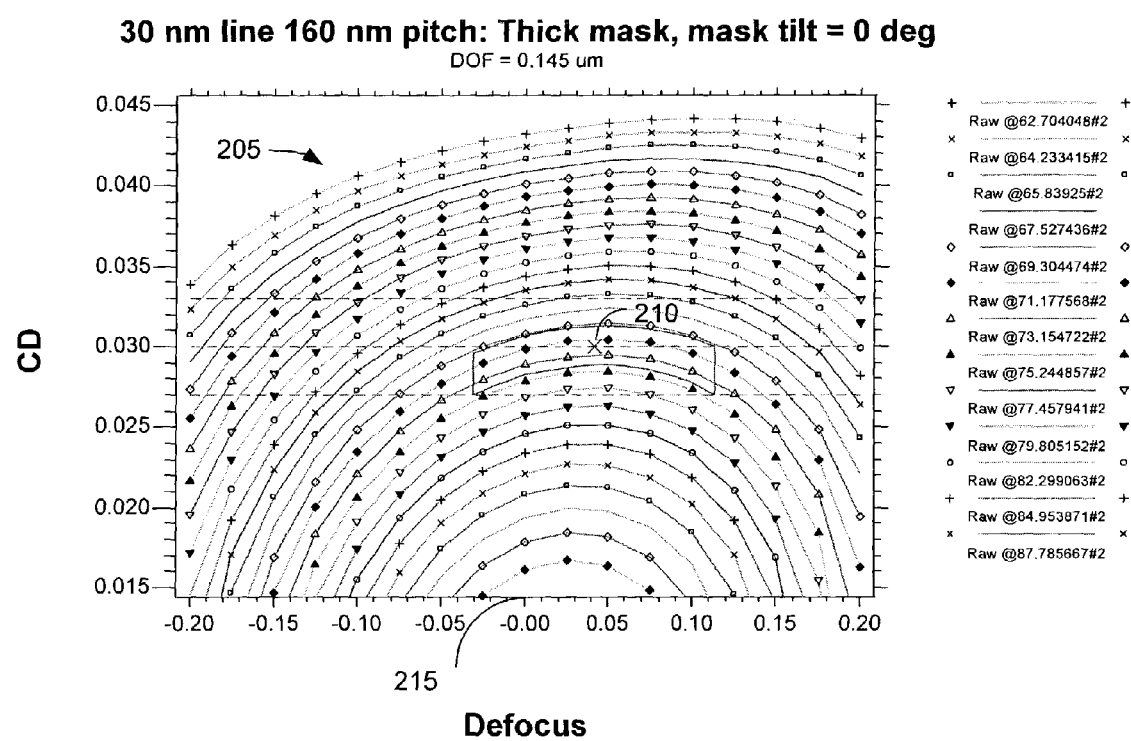
FIG. 2 is a plot showing the Bossung curves for a 30 nm line with 160 nm pitch on a thick mask with zero degree tilt.

The shift in the location of best focus for reflective masks in EUV lithography may be due to the skewed shape of the Bossung curves (CD vs. focus and exposure). FIG. 2 shows the Bossung curves 200 for a 30 nm line with 160 nm pitch on a thick mask with zero degree tilt. The location of best focus 210 in this case has shifted to the right, such that the Bossung curves are not symmetric about zero defocus 215. The location of best focus is not at zero defocus but at about 0.04 μm (40 nm).

Figure 3:
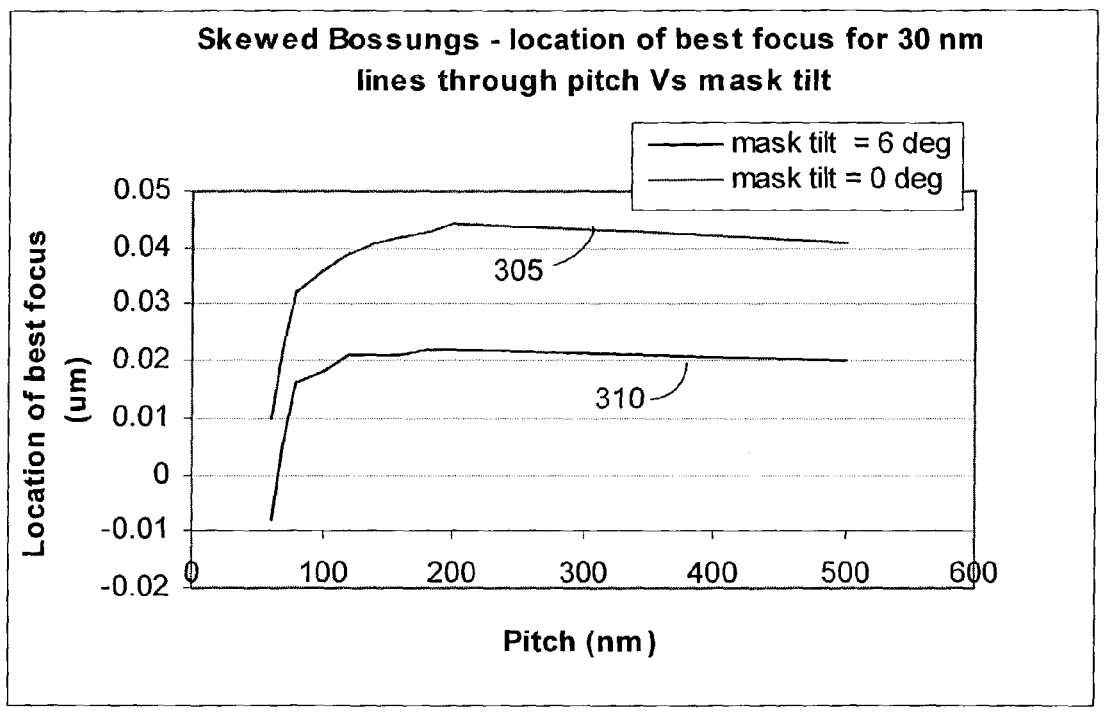
FIG. 3 is a plot showing the location of best focus for 30 nm lines through pitch at zero degrees and six degrees of tilt.

FIG. 3 shows the location of best focus for 30 nm lines at zero degrees 305 and six degrees 305 of tilt. The depth of focus of 30 nm isolated lines in a typical EUV lithography system may be about 150 nm to 200 nm. The difference in the location of best focus between isolated lines and nested lines in this range may be as high as 30 nm, which may reduce the overall process window by about 20%.

A shift in the location of best focus may also be caused by aberrations in a lens. In an embodiment, selective aberrations may be introduced into one or more mirror surfaces in the lithography system to compensate for the shift in best focus inherent to reflective masks.

In a lens system, lens aberrations result in a deviation of the wavefront from the ideal. The aberration of a ray may be denoted by five sums called the Siedel sums. Each of these sums denotes a contribution from a classical form of monochromatic aberration. The monochromatic aberrations include spherical, coma, astigmatism, curvature, and distortion aberrations.

Spherical aberrations may be due to different annular zones in the lens having different focal lengths. The effect of coma is similar to spherical aberrations except that coma affects object points that are not on the optic axis. Coma changes the image to look like a comet, hence the name. Coma arises where different annular zones of the lens have different magnifications so that portions of an off-axis image contributed by particular zones are displaced from the optical axis by varying amounts. Astigmatism is similar to coma in that it impacts object points that are not on the optic axis. However, in astigmatism the spreading of the image takes place along the lens axis. This is due to the focal lengths being different for rays along mutually orthogonal planes. Field curvature is an image defect that causes off-axis image points to focus in different focal planes than the axial image point. The variation in the magnification produced by a lens for different axial distances results in an aberration called distortion.

The deviation of the real spherical wavefront from the ideal in the exit pupil due to these aberrations may be quantified by an optical path (or phase) difference $\Delta(\rho, \theta)$, where $(\rho, \theta)$ are the co-ordinates in the exit pupil.

Zernike polynomials may be used to represent aberrations in diffraction optics. Aberrations described by the Zernike polynomials include the classical Seidel aberrations described above, but also capture higher orders of aberrations.

Zernike polynomials are one of an infinite number of complete sets of polynomials in two real variables, $\rho$ and $\theta$, which are orthogonal in a continuous fashion over the interior of a unit circle. Zernike polynomials are orthogonal only in a continuous fashion over the interior of a unit circle, and in general they will not be orthogonal over a discrete set of data points within a unit circle.

A list of the thirty-seven Zernike polynomial coefficients that make up the aberrations is given in Table 1. The set of thirty-seven polynomial coefficients applies to only one location of the lens. So, if a description of the effect of aberrations such as horizontal/vertical (H/V) delta across n slot positions is required, then n sets of Zernike polynomial coefficients are needed.

TABLE 1

Zernike polynomials

| SVG Zernike | Formula | |
|---|---|---|
| Z1 | 1 | Piston or Bias: No change |
| Z2 | $2\rho \cos \theta$ | x-tilt: Shifts pattern without distortion |
| z3 | $2\rho \sin \theta$ | y-tilt |
| z4 | $\sqrt{3} (2\rho^2 - 1)$ | Defocus: Similar to Siedel field curvature |
| z5 | $\sqrt{6} \rho^2 \cos 2\theta$ | H/V astigmatism: gives H-V delta CD |
| z6 | $\sqrt{6} \rho^2 \sin 2\theta$ | astigmatism 45° |
| z7 | $\sqrt{8} (3\rho^3 - 2\rho) \cos \theta$ | primary y-coma: Results in image asymmetry and pattern dependent position shift |
| z8 | $\sqrt{8} (3\rho^3 - 2\rho) \sin \theta$ | Primary x-coma |
| z9 | $\sqrt{8} \rho^3 \cos 3\theta$ | Higher order tilt & image anomalies with threefold symmetry |
| z10 | $\sqrt{8} \rho^3 \sin 3\theta$ | Higher order tilt 3 leaf clover |
| z11 | $\sqrt{5} (6\rho^4 - 6\rho^2 + 1)$ | Primary spherical |
| z12 | $\sqrt{10} (4\rho^4 - 3\rho^2) \cos 2\theta$ | Secondary astigmatism |
| z13 | $\sqrt{10} (4\rho^4 - 3\rho^2) \sin 2\theta$ | |
| z14 | $\sqrt{10} \rho^4 \cos 4\theta$ | |
| z15 | $\sqrt{10} \rho^4 \sin 4\theta$ | |
| z16 | $\sqrt{12} (10\rho^5 - 12\rho^3 + 3\rho) \cos \theta$ | Secondary y-coma |
| z17 | $\sqrt{12} (10\rho^5 - 12\rho^3 + 3\rho) \sin \theta$ | Secondary x-coma |
| z18 | $\sqrt{12} (5\rho^5 - 4\rho^3) \cos 3\theta$ | |

TABLE 1-continued

Zernike polynomials

| SVG Zernike | Formula | |
|---|---|---|
| z19 | $\sqrt{12} (5\rho^5 - 4\rho^3) \sin 3\theta$ | |
| z20 | $\sqrt{12} \rho^5 \cos 5\theta$ | |
| z21 | $\sqrt{12} \rho^5 \sin 5\theta$ | |
| z22 | $\sqrt{7} (20\rho^6 - 30\rho^4 + 12\rho^2 - 1)$ | Secondary spherical |
| z23 | $\sqrt{14} (15\rho^6 - 20\rho^4 + 6\rho^2) \cos 2\theta$ | |
| z24 | $\sqrt{14} (15\rho^6 - 20\rho^4 + 6\rho^2) \sin 2\theta$ | |
| z25 | $\sqrt{14} (6\rho^6 - 5\rho^4) \cos 4\theta$ | |
| z26 | $\sqrt{14} (6\rho^6 - 5\rho^4) \sin 4\theta$ | |
| z27 | $\sqrt{14} \rho^6 \cos 6\theta$ | |
| z28 | $\sqrt{14} \rho^6 \sin 6\theta$ | |
| z29 | $4 (35\rho^7 - 60\rho^5 + 30\rho^3 - 4\rho) \cos \theta$ | Tertiary y-coma |
| z30 | $4 (35\rho^7 - 60\rho^5 + 30\rho^3 - 4\rho) \sin \theta$ | Tertiary x-coma |
| z31 | $4 (21\rho^7 - 30\rho^5 + 10\rho^3) \cos 3\theta$ | |
| z32 | $4 (21\rho^7 - 30\rho^5 + 10\rho^3) \sin 3\theta$ | |
| z33 | $4 (7\rho^7 - 6\rho^5) \cos 5\theta$ | |
| z34 | $4 (7\rho^7 - 6\rho^5) \sin 5\theta$ | |
| z35 | $4\rho^7 \cos 7\theta$ | |
| z36 | $4\rho^7 \sin 7\theta$ | |
| z37 | $3 (70\rho^8 - 140\rho^6 + 90\rho^4 - 20\rho^2 + 1)$ | Tertiary spherical |

The Zernike aberrations are made up of one or more classical Siedel aberrations. The classical aberration of the highest degree in pupil coordinates may be optimally balanced with those of equal and lower degrees such that its variance across the pupil is minimized. For example, the Z11 polynomial 1 consists of the primary spherical aberration $\sigma^4$ optimally balanced with a $\rho^2$ defocus term to minimize its variance.

Figure 4:
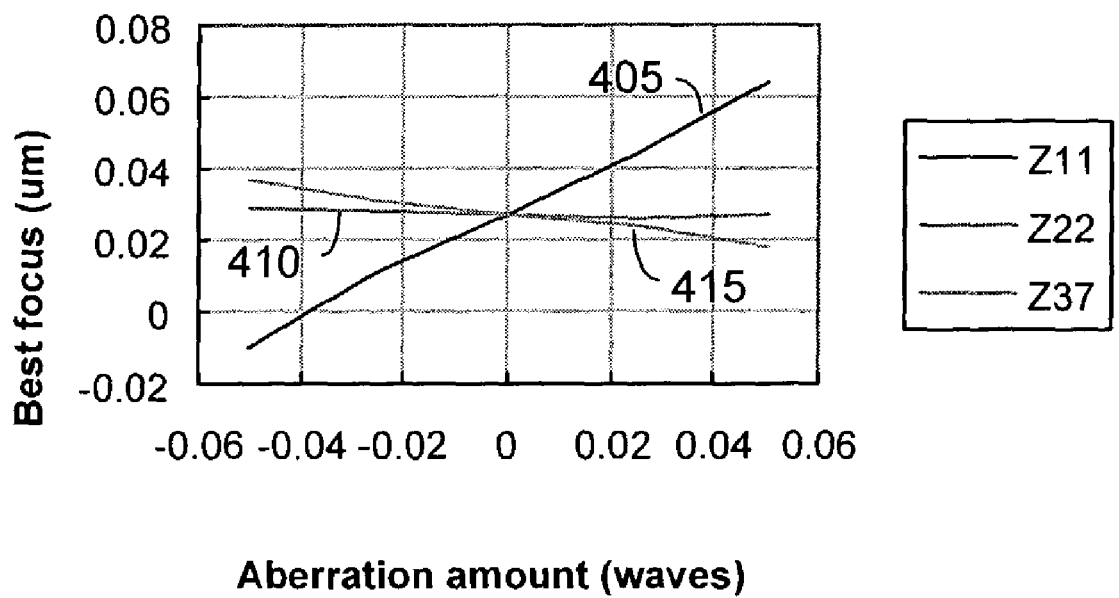
FIG. 4 is a plot showing the impact of primary, secondary, and tertiary spherical aberrations on the location of best focus for semi-isolated 30 nm lines.

FIG. 4 shows the impact of primary 405, secondary 410, and tertiary 415 spherical aberrations (Z11, Z22, and Z37, respectively) on the location of best focus for semi-isolated 30 nm lines. It can be seen that Z11 has the largest impact, and the change in the direction of best focus (into or away from the wafer plane) depends on the sign of the spherical aberration (i.e., positive or negative).

Figure 5:
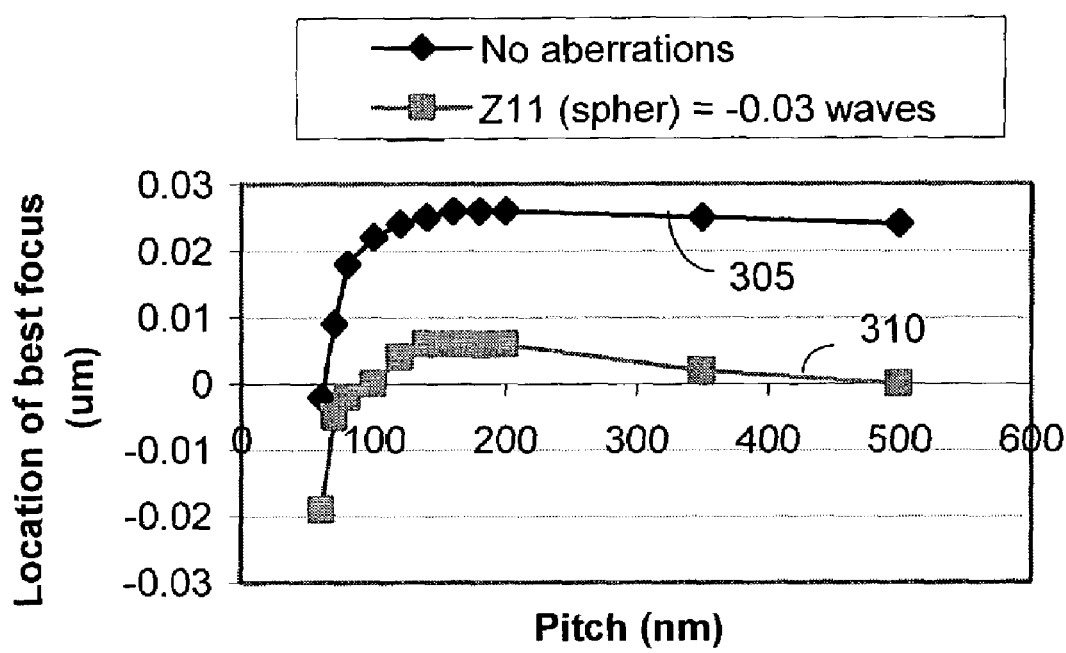
FIG. 5 is a plot showing the effect of introducing a spherical aberration on the location of best focus for 30 nm lines at zero degrees and six degrees of tilt.

In an embodiment, small amounts of primary spherical aberrations (Z11) may be introduced into a mirror surface in the lithography system 100 to compensate for the shift in location of best focus inherent to reflective masks. For most pitches, the best focus range is reduced to about 10 nm, as shown in FIG. 5, as opposed to 30 nm for the case of no aberrations. This corresponds to about a 300% improvement in the location of best focus.

Aberrations may be introduced on a mirror surface by selective polishing of the surface. For example, QED Technologies of Rochester, N.Y. produces computer-controlled polishing tools which may be used to introduce aberrations into an optical surface. The polishing tool may use a "controllable" fluid, e.g., a fluid with magnetorheological (MR) properties, to polish optical surfaces. The tool may use an algorithm which determines the local polish rate to produce a desired surface geometry. The tool may enable a user to create a surface topography on a mirror based on a mathematical description. For example, the topography of a spherical aberration (Z11) may be described by the equation $1-6(x^2+y^2)+6(x^2+y^2)^2$. Using this formula, the computer-controlled polishing tool may generate the required surface topography to give the desired level of a spherical aberration (Z11) on the mirror surface.

Figure 6:
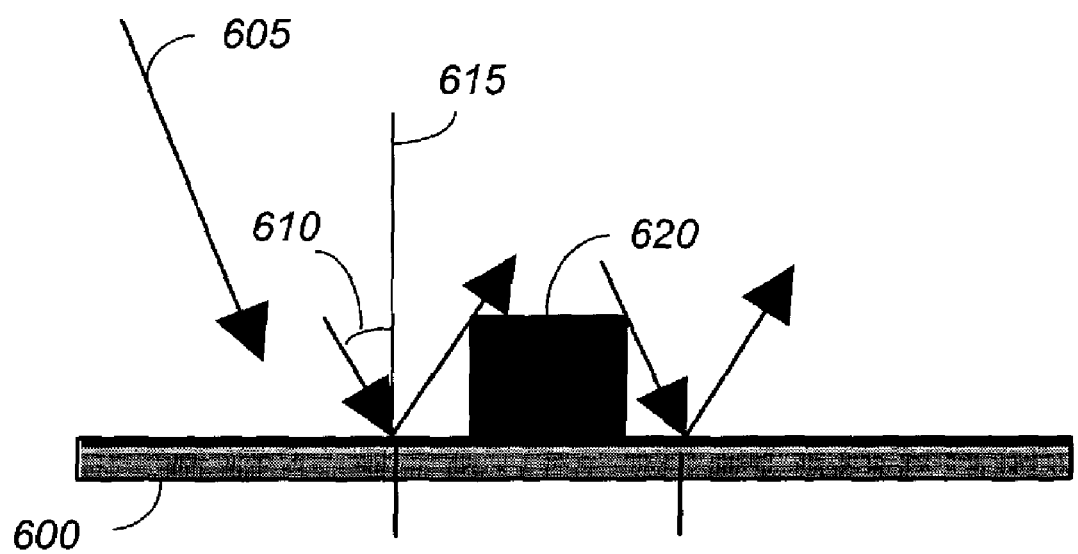
FIG. 6 is a side view of a reflective mask illuminated with radiation at an angle of incidence.

Another optical effect associated with reflective masks is pattern shift due to a shadowing effect. As shown in FIG. 6, light 605 may be directed to the reflective mask at an incident angle 610 from normal 615. The angle of incidence may be, e.g., about 6 degrees from normal. Due to this angle of incidence, features 620 parallel to the plane of incidence (e.g., horizontal features) may exhibit a shadowing effect. Features parallel to the plane of incidence (e.g., vertical features) may not exhibit the shadowing effect.

Figure 7:
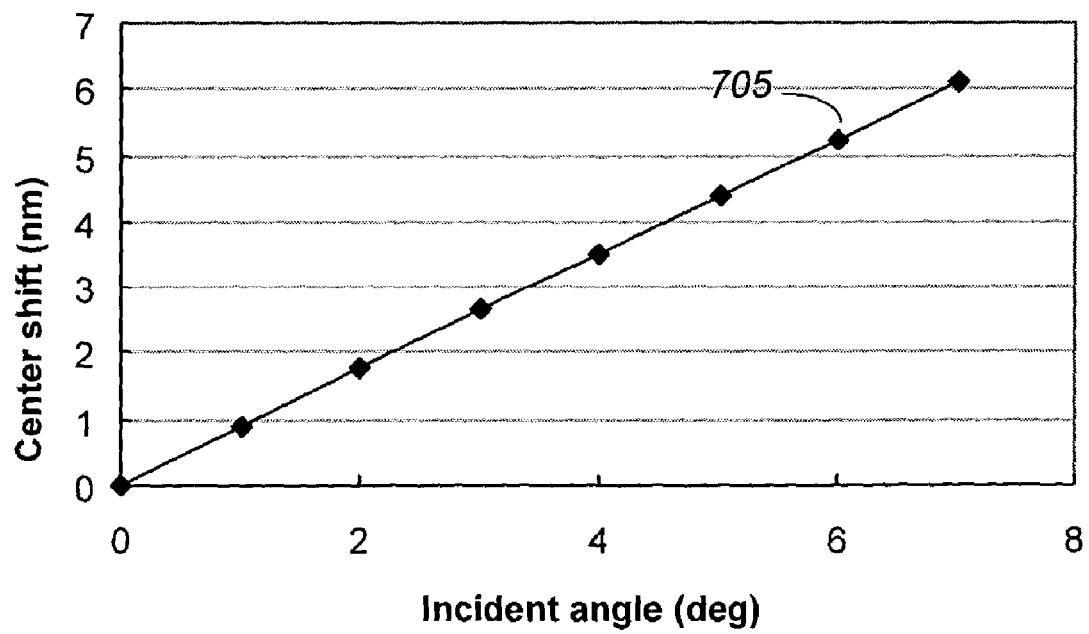
FIG. 7 is a plot showing the relationship between center shift and incident angle.

As shown in FIG. 7, the larger the incident angle the greater the pattern shift. For 30 nm features that are oriented perpendicular to the plane of incidence of the light at the reticle (at 6° off-normal), the pattern shift 705 may be about 5 nm. However, the alignment budget for the lithographic imaging operation may only be about 15 nm. This pattern shift needs to be compensated for to prevent alignment problems between features on the mask. Misalignments may lead to imbalances in the IC, which could result in anomalous circuit behavior, or in extreme cases, critical defects such as shorts.

A coma aberration on a lens may also cause such a pattern shift. In an embodiment, the pattern shift due to the shadowing effect may be compensated by introducing small amounts of coma aberration.

Figure 8:
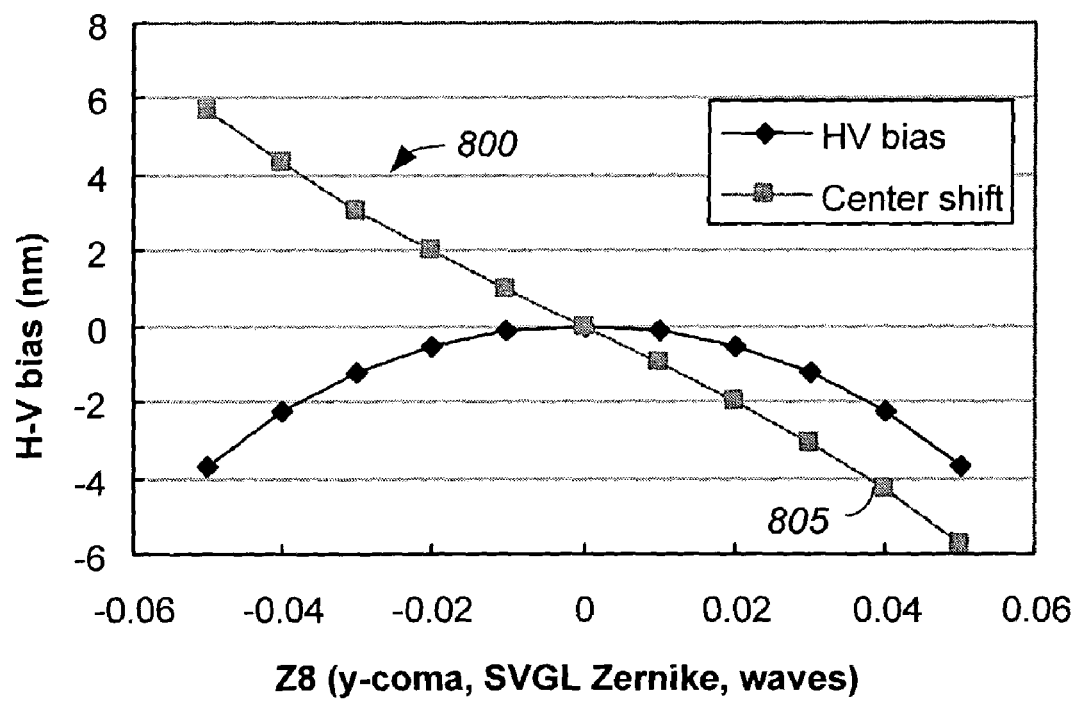
FIG. 8 is a plot showing the effect of introducing a coma aberration on center shift.

FIG. 8 shows the center shift 800 due to Z8 (primary y-coma) aberration. A coma aberration amount of +0.04 waves that results in a −4 nm shift 805 may compensate for +4 nm shift that occurs due to a 5° angle of incidence. The topography of a coma aberration (Z8) may be described by the equation $7x(-2+3(x^2+y^2))$. The coma aberration may be introduced into a mirror surface in the lithographic system using a computer-controlled polishing tool, as describe above.

A number of embodiments have been described. Nevertheless, it will be understood that various modifications may be made without departing from the spirit and scope of the invention. Accordingly, other embodiments are within the scope of the following claims.

The invention claimed is:

1. A method comprising:
    determining, based on at least one of a pitch and a feature size of features to be patterned using a reflective mask, an optical effect caused by the reflective mask in a lithographic system; and
    introducing an aberration in a reflective surface in an optical path including the reflective mask, said aberration operative to produce an optical effect similar to the optical effect caused by the reflective mask.

2. The method of claim 1, wherein said introducing the aberration comprises introducing an aberration that has an optical effect with a magnitude substantially equal to a magnitude of the optical effect caused by the reflective mask.

3. The method of claim 1, wherein said determining comprises determining a shift in a location of best focus caused by the reflective mask.

4. The method of claim 3, wherein said introducing the aberration comprise introducing an aberration operative to shift the location of best focus towards zero defocus.

5. The method of claim 3, wherein said introducing the aberration comprises introducing a spherical aberration.

6. The method of claim 3, wherein said introducing the aberration comprises introducing a Z11 spherical aberration.

7. The method of claim 1, wherein said determining comprises determining a pattern shift in a first direction caused by the reflective mask.

8. The method of claim 7, wherein said introducing the aberration comprise introducing an aberration operative to create a pattern shift in a direction substantially opposite to the first direction.

9. The method of claim 7, wherein said introducing the aberration comprises introducing a coma aberration.

10. The method of claim 7, wherein said introducing the aberration comprises introducing a Z8 coma aberration.

11. The method of claim 1, wherein said introducing the aberration comprises selectively polishing the reflective surface to change a topology of said surface to include the aberration.

* * * * *